United States Patent
Zukic et al.

(10) Patent No.: US 11,523,228 B2
(45) Date of Patent: Dec. 6, 2022

(54) METHOD FOR PROCESSING AN ACOUSTIC SPEECH INPUT SIGNAL AND AUDIO PROCESSING DEVICE

(71) Applicant: Two Pi GMBH, Vienna (AT)

(72) Inventors: Tarik Zukic, Vienna (AT); Ludwig Kollenz, Hohenau an der March (AT)

(73) Assignee: Two Pi GMBH, Vienna (AT)

( * ) Notice: Subject to any disclaimer, the term of this patent is extended or adjusted under 35 U.S.C. 154(b) by 335 days.

(21) Appl. No.: 16/759,243

(22) PCT Filed: Nov. 2, 2017

(86) PCT No.: PCT/AT2017/060291
§ 371 (c)(1),
(2) Date: Apr. 24, 2020

(87) PCT Pub. No.: WO2019/084580
PCT Pub. Date: May 9, 2019

(65) Prior Publication Data
US 2021/0006910 A1  Jan. 7, 2021

(51) Int. Cl.
*H04R 25/00* (2006.01)
*G10L 21/0364* (2013.01)

(52) U.S. Cl.
CPC ........ *H04R 25/356* (2013.01); *G10L 21/0364* (2013.01); *H04R 25/505* (2013.01); *H04R 2225/43* (2013.01)

(58) Field of Classification Search
CPC ................ H04R 25/356; H04R 25/505; H04R 2225/43; G10L 21/0364
See application file for complete search history.

(56) References Cited

U.S. PATENT DOCUMENTS

| 10,362,412 | B2 * | 7/2019 | Lesimple | H04R 25/356 |
| 2011/0249843 | A1 * | 10/2011 | Holmberg | H04R 25/353 |
| | | | | 381/98 |

(Continued)

FOREIGN PATENT DOCUMENTS

| EP | 2560410 A1 | 2/2013 |
| WO | 2019084580 A1 | 5/2019 |

OTHER PUBLICATIONS

International Search Report and Written Opinion for International Application No. PCT/AT2017/060291, Search completed Apr. 17, 2018, dated Apr. 30, 2018, 11 Pgs.

(Continued)

*Primary Examiner* — Alexander Krzystan
*Assistant Examiner* — Julie X Dang
(74) *Attorney, Agent, or Firm* — KPPB LLP (57) ABSTRACT

The invention relates to a method for processing an acoustic input signal, preferably a speech signal, said method comprising the following steps: a) receiving a digital representation ($S_{in}$) of an acoustic input signal, b) calculating at least one statistical parameter (P) of the digital representation ($S_{in}$) of the acoustic input signal, c) calculating a compression ratio function ($CR_f$) based—on a prescribed constant compression ratio ($CR_{pr}$), said prescribed constant compression ratio ($CR_{pr}$) uniformly mapping acoustic input signals of a selected magnitude to acoustic output signals of a selected magnitude, and—on at least one statistical parameter (P) calculated in step b), and d) applying the non-uniform compression ratio function ($CR_f$) according to step c) on the digital representation ($S_{in}$) of the acoustic input signal delivering a digital representation ($S_{out}$) of an enhanced acoustic output signal.

10 Claims, 5 Drawing Sheets

(56) References Cited

U.S. PATENT DOCUMENTS

2013/0230198 A1    9/2013   Giese et al.
2013/0287236 A1   10/2013   Kates
2015/0264482 A1    9/2015   Neely

OTHER PUBLICATIONS

Keidser et al., "The NAL-NL2 prescription procedure", Audiology Research, vol. 1:e24, 2011, pp. 88-90.
Martin, "Noise Power Spectral Density Estimation Based on Optimal Smoothing and Minimum Statistics", IEEE Transactions on Speech and Audio Processing, vol. 9, No. 5, Jul. 2001, pp. 504-512.
Moore, "Cochlear Hearing Loss: Physiological, Psychological and Technical Issues", John Wiley & Sons, 2nd Edition, Nov. 2007, 339 pgs.
Moore et al., "Preferred Compression Speed for Speech and Music and Its Relationship to Sensitivity to Temporal Fine Structure", Trends in Hearing, vol. 20, Sep. 7, 2016, 15 pgs.
Plomp, "The negative effect of amplitude compression in multichannel hearing aids in the light of the modulation-transfer function", The Journal of the Acoustical Society of America, vol. 83, No. 2322, Jun. 1988, pp. 2322-2327.

\* cited by examiner

METHOD FOR PROCESSING AN ACOUSTIC SPEECH INPUT SIGNAL AND AUDIO PROCESSING DEVICE

CROSS-REFERENCE TO RELATED APPLICATION

This application is a national stage of Application No. PCT/AT2017/060291, filed Nov. 2, 2017, the disclosure of which is incorporated herein by reference in its entirety.

FIELD OF THE INVENTION AND DESCRIPTION OF PRIOR ART

The invention relates to a method for processing an acoustic input signal, preferably a speech signal.

Furthermore, the invention also relates to an audio processing device and a hearing aid.

Hearing impairment is often characterized by elevated hearing threshold—an acoustical level that marks a border between audible and inaudible sounds. As a consequence of the threshold increase some soft sounds become inaudible, resulting in a decline in general hearing capability and particularly in perception of soft speech. Another characteristic of such hearing impairment is the abnormal perception of loudness, called "loudness recruitment", where the perceived loudness increases much faster with increased signal level—than is the case in normal hearing. In other words, the dynamic range of impaired hearing is reduced.

Hearing devices with implemented dynamic range compression have thus two goals: a.) to amplify the intensity of the acoustical signals in order to elevate them above the hearing threshold—making them audible and b.) to control the loudness of the outputted, processed signal in order to maintain the same perceived loudness as the normal hearing would have. This is achieved by mapping larger dynamic range of audible signals to the narrower range of residual hearing, a process known as dynamic range compression.

Figure 1A:
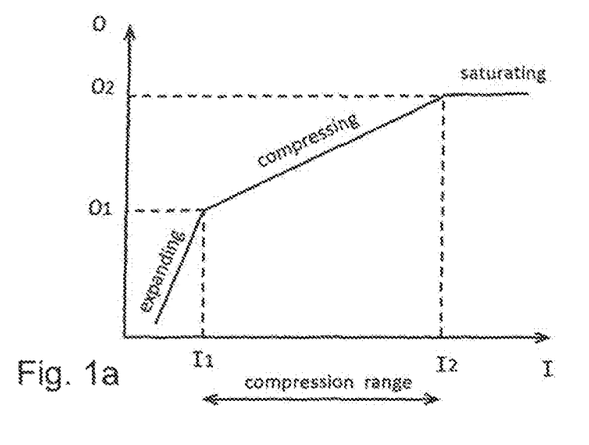
FIG. 1a an Input-Output-Curve representing audio processing according to the state of the art, FIG. 1b an Input-Output-Curve obtained by audio processing according to the present invention, FIG. 2 a schematic overview of an audio processing method according to the state of the art, FIG. 3 histograms of speech signals representing soft, medium and loud speech, FIG. 4a an I-O curve according to the state of the art, FIG. 4b an I-G curve corresponding to the I-O curve of FIG. 4a, FIGS. 4c and d gradients of the curves of FIG. 4a and FIG. 4b, FIG. 5a an exemplary I-O curve obtained by a compression ratio function according to the present invention, FIG. 5b an I-G curve corresponding to the I-O curve of FIG. 5a, FIGS. 5c and d gradients of the curves of FIG. 5a and FIG. 5b, FIG. 6 a schematic overview of an exemplary embodiment of an audio processing method according to the present invention, and FIG. 7 a typical smoothed histogram for speech input of medium loudness and a corresponding gain curve and a compression ratio function.

The mapping of input dynamic range to output dynamic range is usually fully described by an Input-Output curve O(I) that determines the level of output for given level of input as depicted in FIG. 1a. This curve is commonly determined according to the intended use of the device, for example for compensation of individual hearing loss. The most relevant part of the O(I) curve, that affects the important signals such as speech, is a straight line spanning low-level speech signals and high-level speech signals and whose slope corresponds to intended Compression Ratio CR. Compression Ratio is defined as the ratio between input dynamic range and corresponding output dynamic range:

$$CR = \frac{highlevel - lowlevel}{\text{Output}(highlevel) - \text{Output}(lowlevel)}$$

For example: if input signal shows a dynamic range of 30 dB (ranging between lowlevel=50 dB SPL and highlevel=80 dB SPL) and the output signal after compression requires a range of 10 dB (ranging for example from 75 dB SPL and 85 dB SPL), then the compression ratio is CR=3.

The shape of O(I) curve is individually calculated for a audiometrically obtained hearing loss parameters using some of the known prescription formulas such as NAL-NL2 or DSLio [NAL 2011]. Resulting compression ratios take usually values from 1.0 to 3.0 and increase with the degree of hearing loss. CR=1.0 correspond to level-invariant amplification, or linear amplification. To fully determine the O(I) curve a gain-offset is also specified.

While compression of dynamic range (reduction in the dynamics) of the acoustical signal can be offset by the inherent expansion of the impaired hearing—and might result in optimal perception, some studies show that sometimes users of hearing aids prefer larger dynamic range. [Plomp 1988]

The reasons for this preference are in the significance of Temporary Fine Structures (TFS) of speech for perception and recognition. However, not all hearing impaired individuals are equally sensitive to TFS. In a recent study [Moore 2016] the preference for fast compression correlates with "TFS sensitivity", so it can happen that a subject prefers either more or less compression. But if the processed signal is music—all subject show preference for more dynamics which corresponds with slower dynamic compression.

Another drawback of fast-acting compressor comes from the fact that release-times are in general by an order of magnitude longer than attack-times. The energy estimation therefore inherently overestimates the real energy of the weaker sections of the signal, which for low input levels can lead to loss of audibility.

Several proposals are addressing the drawbacks of fast-acting dynamic compression. The previously proposed schemes aim at reducing amount of compression by either making time-constants longer or slanting the slope of the O(I) curve towards linear amplification. However, optimization of those parameters is a trade-off with reaction speed of compressor which results in insufficient control of suddenly occurring impulse sounds.

SUMMARY OF THE INVENTION

It is therefore an object of the invention to provide a method for processing an acoustic input signal, preferably a speech signal, that overcomes the drawbacks of the state of the art.

This object is achieved by a said method according to the invention of the above mentioned kind, comprising the following steps:

a) receiving a digital representation of an acoustic input signal, b) calculating at least one statistical parameter of the digital representation of the acoustic input signal, c) calculating a compression ratio function based
- on a prescribed constant compression ratio, said prescribed constant compression ratio uniformly mapping acoustic input signals of a selected magnitude to acoustic output signals of a selected magnitude (i.e. the compression curve having only one constant single tilt), and
- on at least one statistical parameter calculated in step b), wherein the compression ratio function deviates from the prescribed constant compression ratio by including a non-uniform mapping of acoustic input signals of a selected magnitude to acoustic output signals of a selected magnitude, wherein the non-uniformity of the mapping procedure is determined based on at least one statistical parameter calculated according to step b), and d) applying the non-uniform compression ratio function according to step c) on the digital representation of the acoustic input signal delivering a digital representation of an enhanced acoustic output signal.

By virtue of these features the method according to the present invention delivers an enhanced acoustic output signal having enhanced audio characteristics. Distortion of the signal of interest—for instance speech signals—is reduced and the dynamic range is optimized, thus resulting in an increased the audio experience. In other words, the method according to the invention implements a non-uniform distribution of compression ratio that minimizes distortion by concerning particular statistical properties of input signal.

For instance, the at least one statistical parameter of the digital representation of the acoustic input signal can comprise information with regard to the frequency ranges, sound pressure levels within range, sound pressure levels within a certain period of time and/or maxima or minima of sound pressure levels. More complex parameters as Signal to Noise Ratio (SNR) or Speech activity can also be statistically observed. Of course, it is also possible to include a number of parameters that contain information with regard to aforementioned signal characteristics.

Preferably, the prescribed constant compression ratio includes information with regard to a prescribed minimum magnitude of an input signal and a prescribed minimum magnitude of a corresponding output signal and a prescribed maximum magnitude of an input signal and a prescribed maximum magnitude of a corresponding output signal. This information can be provided by presetted audiometric profiles or for instance by audiological inspection of a patient.

Advantageously, a minimum magnitude of the input signal and a minimum magnitude of the output signal of the non-uniform compression ratio function equals the prescribed minimum magnitude of an input signal and the prescribed minimum magnitude of the corresponding output signal of the prescribed constant compression ratio, and wherein a maximum magnitude of an input signal and a maximum magnitude of an output signal of the non-uniform compression ratio function equals the prescribed maximum magnitude of the input signal and the prescribed maximal magnitude of the output signal of the prescribed constant compression ratio, and wherein the non-uniform compression ratio function matches a non-uniform continuous curve stretching from a first point given by the minimum magnitude of the input signal and the minimum magnitude of the output signal to a second point given by the maximum magnitude of the input signal and a maximum magnitude of the output signal.

Figure 1B:
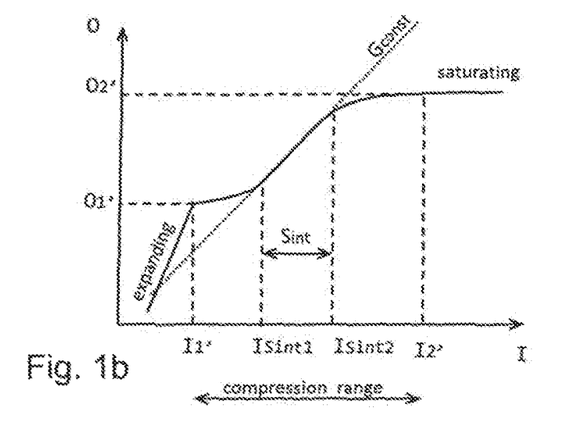

With regard to FIG. 1$a$ and FIG. 1$b$ that means that I1'=I1, I2'=I2, O1'=O1, O2'=O2. This allows to maintain the dynamic range in its entirety and still allows to optimize the compression ratio function within the given dynamic range. The dynamic range can be delimited and thus determined by the extent of the hearing loss of a patient.

Preferably, the non-uniform compression ratio function is only applied to input signal within a range between the minimum prescribed input signal and the maximum prescribed input signal. This range also referred to as compression range.

Advantageously, the at least one statistical parameter calculated in step b) comprises information with regard to the magnitudes of the input signal at given sample rates. The sampling rate for audible audio signals may amount up to over 44 kHz. However, depending on the signal of interest, sampling rates up to 500 Hz may already provide sufficient information when asserting statistical parameters of speech signals. As already mentioned before, the statistical parameters may refer to frequency ranges, sound pressure levels within range, sound pressure levels within a certain period of time and/or maxima or minima of sound pressure levels. More complex parameters as Signal to Noise Ratio (SNR) or Speech activity can also be statistically observed.

In particular, the at least one statistical parameter calculated in step b) can comprise a histogram of magnitudes of the input signal representing samples having a magnitude between 40 and 90 dB SPL and wherein the gradient of the non-uniform compression ratio function essentially matches the envelope of the histogram. The term "essentially matching" means that the gradient of the non-uniform compression ratio function does not be identical to the gradient of the envelope of the histogram. However, it is desirable to match the envelope to a certain extent minimizing deviations to a given threshold of for instance 20%. The term "gradient" refers herein to the differential measured over the Input, i.e. the gradient of the compression ratio function can be defined as $dCRf/dI$.

Advantageously the digital representation of the input signal is split into a number of frequency channels, said frequency channels splitting an initial range of at least 250 Hz to 4 kHz into frequency intervals, said frequency intervals having a reduced frequency range in comparison with the initial range. By splitting the range of 250 Hz to 4 kHz (which is the main frequency range representing speech signals) into frequency channels, it is possible to optimize the compression ratio function for different frequency channels. Thus, different statistical results for different frequency channels can be taken into consideration allowing to optimize the enhancement within each frequency channel but also when merging the frequency channels into a merged output signal.

Advantageously, the compression ratio function for each frequency interval is calculated based on statistical parameters derived not only from that frequency interval (i.e. the present interval), but also from at least one of any other frequency interval, in particular a neighbouring frequency interval. In particular, two or more of the remaining frequency intervals can be taken into account. Preferably, the adjacent frequency intervals are taken into account.

Moreover, to object of the present invention is also achieved by an audio processing device according to the invention, said audio processing device comprising
- a storage medium for storing a program-logic for carrying out the method according to any of the preceding claims, and
- a processor, for carrying out said program-logic and/or the method according to any of the preceding claims.

Preferably said audio processing device is realized in one of the following devices: {mobile phone, headphone, hands free speakerphone, audio speaker, hearing aid}.

Moreover, the present invention also relates to a hearing aid, comprising an audio processing according to the invention, wherein the hearing aid comprises
- means for receiving an acoustic input signal and for transforming the acoustic input signal into a digital representation of the acoustic input signal and delivering the digital representation to the audio processing device, and
- means for transforming the digital output signal of the audio processing device into an enhanced acoustic signal.

The means for transforming the digital output signal into enhanced acoustic speech signal can comprise a digital analogue converter (DAC) and a speaker.

BRIEF DESCRIPTION OF THE DRAWINGS

In the following, in order to further demonstrate the present invention, illustrative and non-restrictive embodiments are discussed, as shown in the drawings, which show.

DETAILED DESCRIPTION OF EMBODIMENTS OF THE INVENTION

In the following figures similar reference signs refer to similar features unless expressly depicted otherwise.

FIG. 1a shows an Input-Output-Curve representing audio processing according to the state of the art. The G(I) and O(I) (i.e. Input-Output-Curve) curves of a dynamic range compressor have to span the entire input and output dynamic range of an audio device, in particular a hearing device. Since the extreme level values at both low and high end usually contain no useful signal and can contain signals of unpleasant or harmful loudness, the O(I) curve is designed so as to reduce audibility of signals from those ranges. For that reason, O(I) curve is usually constructed curvilinear with expansion at low end—to reduce loudness of softest signals such as microphone noise, and saturation at high end—to limit the loudness of the output.

Figure 2:
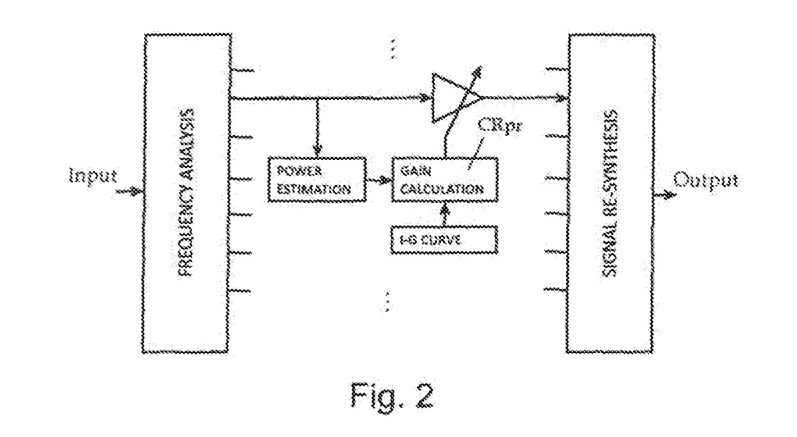

The O(I) curve is used by a compressor to calculate the correct gain in every time instant—according to current estimation (level) of the input signal's energy. The compressor then applies a gain (amplifies signal) accordingly. This process is usually performed in different frequency regions as shown in FIG. 2 (FFT-Gain(controlled)-IFFT). Since energy estimation assumes temporal integration of energy over a time-segment of the input signal, compressor works with time-constants to control the time-behaviour of such energy estimation. The time constants are chosen with multiple rationales. One rationale is that estimation is responsive enough to react to sudden increases of the signal, another is to avoid sudden reactions to pauses in the speech. Those two rationales contributed to a usual determination of time-behavior of compressor by its attack-time constant and release-time constant.

In order to optimally follow the envelope of speech, the attack times are typically chosen as 2-10 ms and the release times as 20-150 ms. Compressors employing time constants in this range are often referred to as fast-acting compressors or syllabic compressors.

Another function of the dynamic compressor is to prevent extensive outputs. Speech signal is usually accompanied by a background noise that can differ in level and can contain short-time energy spikes, called transient noise, that significantly exceed the peak energy of the speech. Dynamic compressor has to react in time and apply reduced gain to those spikes. For that reason dynamic compressor can employ an output limiter that corresponds to a compression using an infinite compression ratio and very short attack-times of 1-5 ms. In some signal processing schemes there is a dedicated algorithm that suppresses the transient noise.

While fast-acting dynamic compressor provides very accurate mapping of the audible dynamic range to the dynamic range of residual hearing, it is not without drawbacks. Shorter constants introduce more distortion. Studies have shown that there exist a subjective preference for uncompressed signals—as long as the signal is audible and is not exceeding the uncomfortable levels. Some studies also show better intelligibility scores for such uncompressed signals.

Central to the O(I) curve is a compression range, a linear part that maps a section of input dynamic range to a section of output dynamic range with a single, sloped line as shown in FIG. 1. For example a compressive area in common systems covers dynamic range of speech. It starts with "compression threshold" aligned with soft speech at 50 dB SPL of input—and maintains constant slope of O(I) to the levels representing loud speech at 85 dB SPL. This compression part of the O(I) curve is characterized by a uniform compression ratio that takes values between $CR_{pr}=1$ and $CR_{pr}=3$.

FIG. 1b shows in contrast to FIG. 1a an I-O-curve that is obtained by applying the method according to the invention. As can be seen in FIG. 1b, contrary to the I-O-curve of FIG. 1a the curve does not consist only of a single slope within the compression range, but merely consists of different slopes connected to each other with steadily changing compression ratio. In this example, the I-O-curve according to FIG. 1b comprises within the compression range a flatter section spanning from I1' to $I_{Sint1}$, an increasingly tilted section spanning form $I_{Sint1}$ to $I_{Sint2}$ and another flatter section spanning from ISint2 to I2'. In this I-O-curve statistical information with regard to the input signal is used in order to optimize the I-O-curve shown in FIG. 1a towards the I-O-curve shown in FIG. 1b. Therein, statistical evaluation of the input signal which can be performed based upon at least one statistical parameter P delivers information with regard to the likelihood of occurrence of signals within a ranges of certain magnitudes. The compression curve then can be optimized by minimizing the distortion within the range of signals having the highest likelihood of occurrence by adjusting the compression ratio towards a non-uniform compression ratio. In the exemplary curve according to FIG. 1b the increased likelihood is assumed or measured to occur between the input levels $I_{sint1}$ to $I_{sint2}$. This range is in the following also referred to as most likely range of occurrence of a signal of interest $S_{int}$. The signal of interest can be a speech signal, which can be recognized by features known to the person skilled in the art—for instance by frequency patterns, sound pressure levels, envelopes of said patterns etc.

The differences of the I-O-curves of FIG. 1a and FIG. 1b will be discussed in more detail by taking the FIGS. 4a to d and FIGS. 5a to d into account. FIGS. 4a to d) show different properties of the compression curve of FIG. 1a, i.e. the compression curve according to the state of the art. FIG. 4b discloses the Gain-curve that results from the compression curve according to FIG. 1a and respectively FIG. 4a. As can be seen in FIG. 4b the gain is not constant over the different magnitudes of the input signal. FIG. 4c show a corresponding gradient of the compression curve, which is constant as the compression curve according to FIG. 4a has only a single tilt. Same applies on the gradient of the gain curve shown in FIG. 4d.

FIGS. 5a to 5d disclose different properties of the compression curve of FIG. 1b, i.e. an exemplary compression curve according to the present invention. Therein, the gradient of the compression curve shown in FIG. 5c is chosen in order to match least one statistical parameter P of the digital representation $S_{in}$ (see FIG. 6) of the acoustic input signal. In this exemplary embodiment, the gradient of the compression curve matches the envelope E (which serves in this case as an exemplary statistical parameter P) of the energy histograms for soft speech signals shown in FIG. 3, hence said gradient of the compression curve is optimized for either soft, medium or loud speech signals. At the peak of likelihood the curve flattens out and the gradient roughly equals zero. As can be seen in FIGS. 5a and 5b, this flat peak translates into a constant gain within the range of said peak and into a constant tilt within the compression curve within the range of said peak, wherein within this range the tilt of the compression curve is of such a kind that an extension intersects the I-O-curve in its origin. Consequently, the Gain of the I-O-curve is widely constant within the range of the signal of interest $S_{int}$, allowing highest fidelity of the signal of interest and reducing distortions resulting from different gains for different signal-levels. As such, the remaining dynamic range of a patient having hearing impairment can be widely utilized for a distortion-free representation of the signal of interest. Consequently, speech signals can be better understood. Same advantages also apply on other signals of interest, for instance music or ambient sounds. The method for processing an acoustic input signal according to the invention can be applied on any acoustic input signal. The compression curve of FIG. 5a and FIG. 1b is also referred to as compression ratio function $CR_f$ as this curve is obtained by a function as described above, taking into account at least one parameter of the signal of interest.

In other words, the method for processing an acoustic input signal according to the present invention comprises the following steps:
a) receiving a digital representation $S_{in}$ of an acoustic input signal (see FIG. 6),
b) calculating at least one statistical parameter (P) of the digital representation $(S_{in})$ of the acoustic input signal,
c) calculating a compression ratio function $(CR_f)$ based
   on a prescribed constant compression ratio $(CR_{pr})$, said prescribed constant compression ratio $(CR_{pr})$ uniformly mapping acoustic input signals of a selected magnitude to acoustic output signals of a selected magnitude, and
   on at least one statistical parameter (P) calculated in step b),
wherein the compression ratio function $(CR_f)$ deviates from the prescribed constant compression ratio $(CR_{pr})$ by including a non-uniform mapping of acoustic input signals of a selected magnitude to acoustic output signals of a selected magnitude, wherein the non-uniformity of the mapping procedure is determined based on at least one statistical parameter (P) calculated according to step b), and
d) applying the non-uniform compression ratio function $(CR_f)$ according to step c) on the digital representation $(S_{in})$ of the acoustic input signal delivering a digital representation $(S_{out})$ of an enhanced acoustic output signal.

The prescribed constant compression ratio $CR_{pr}$ includes information with regard to a prescribed minimum magnitude I1 of an input signal and a prescribed minimum magnitude O1 of a corresponding output signal and a prescribed maximum magnitude I2 of an input signal and a prescribed maximum magnitude O2 of a corresponding output signal, which can be obtained by a given I-O-Curve (see for instance FIG. 1a and FIG. 4a) which can be chosen by prearranged curves or by measurements performed by an audiological inspection of a patient.

The curves obtained in FIGS. 1b and 5a make use of the given curves 1a and 4a by using the prescribed compression ratio $CR_{PR}$ as follows:
a minimum magnitude of the input signal and a minimum magnitude of the output signal $O_1'$ of the non-uniform compression ratio function $CR_f$ equals the prescribed minimum magnitude $I_1$ of an input signal and the prescribed minimum magnitude $O_1$ of the corresponding output signal of the prescribed constant compression ratio $CR_{pr}$,
and wherein a maximum magnitude $I_2'$ of an input signal and a maximum magnitude $O_2'$ of an output signal of the non-uniform compression ratio function $CR_f$ equals the prescribed maximum magnitude $I_2$ of the input signal and the prescribed maximal magnitude $O_2$ of the output signal of the prescribed constant compression ratio $CR_{pr}$,
and wherein the non-uniform compression ratio function $CR_f$ matches a non-uniform continuous curve stretching from a first point given by the minimum magnitude of the input signal and the minimum magnitude $O_1'$ of the output signal to a second point given by the maximum magnitude of the input signal $I_2$ and a maximum magnitude of the output signal $O_2'$.

The method can be further developed into an embodiment, wherein the non-uniform compression ratio function $CR_f$ is only applied to input signal within a range between the minimum prescribed input signal $I_1$ and the maximum prescribed input signal $I_2$ (i.e. compression range).

Figure 6:
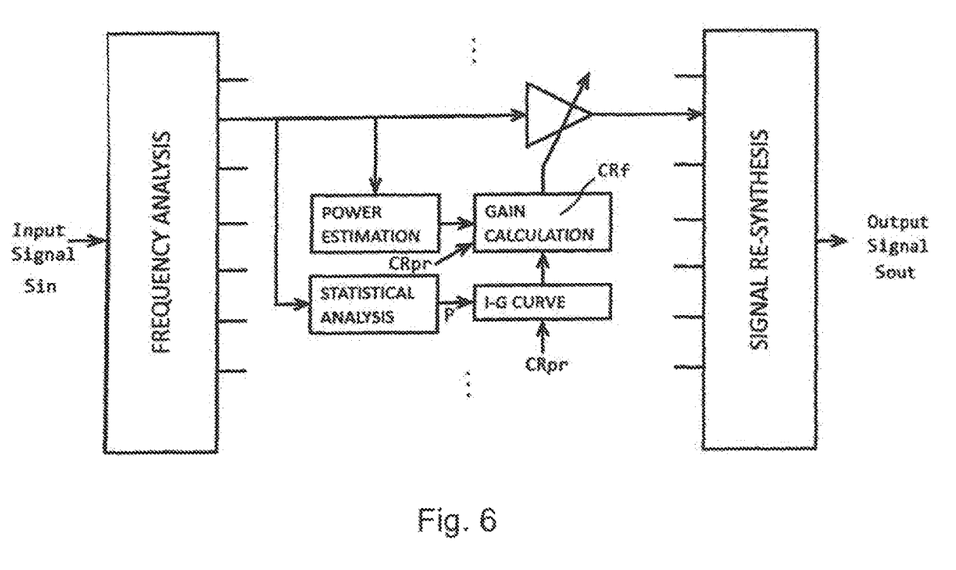

As can be seen in FIG. 6, the method according to the present invention can be applied to specific frequency intervals of a signal or the entire input signal which is then split into a number of frequency intervals. The digital representation $S_{in}$ of the input signal can be split into a number of frequency channels (bins), said frequency channels splitting an initial range of at least 250 Hz to 4 kHz into frequency intervals, said frequency intervals having a reduced frequency range in comparison with the initial range. The frequency intervals can overlap but do not have to. They can also simply split the entire frequency range into even or uneven, in particular logarithmic range intervals.

The invention also relates to an audio processing device not shown in the figures, said device comprising a storage medium for storing a program-logic for carrying out the method according to any of the preceding claims, and a processor, for carrying out said program-logic and/or the method according to the invention.

Preferably, the audio processing device can be realized in one of the following devices: {mobile phone, headphone, hands free speakerphone, audio speaker, hearing aid}.

The invention is primarily targeting the processing of speech signals, but is not limited to that case.

Further Exemplary Details of the Invention

The actual input signal is not necessarily covering the whole input dynamic range at every time. Due to nature of the real-world signals the actual input signal will in given acoustical situation take energy values that are concentrated in a limited portion of the input dynamic range. For example, energy of soft speech will rarely exceed levels of 75 dB SPL, leaving the upper part of the range "vacant".

Figure 3:
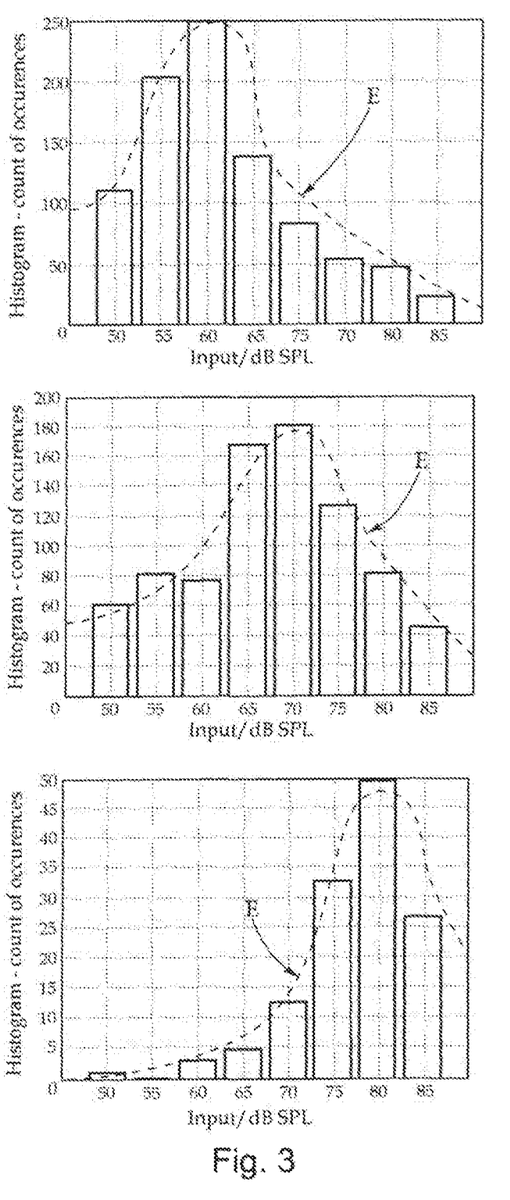

The distribution of signal energy values can be statistically represented in a histogram, whereas frequency of occurrence of one energy level is counted over a certain period of time. FIG. 3 shows example energy histograms for soft, medium and loud speech. Acoustical signals are complex and carry other qualities than only levels of their energy. Therefore the use of histogram can be generalized to represent any variable that stands for importance of signal for the user.

Starting with the observation that not all parts of the input dynamic range are of same importance for the user in given acoustical situation, and that important parts can benefit more from reduced distortion of compressor we follow the rationale of 1.) maintain overall mapping of input range to output range and 2.) reduce distortion of the output signal by applying most linear amplification to most important parts of input dynamic range.

To satisfy those rationales the new method employs a non-uniformly distributed compression ratio. The distribution of compression ratio is calculated in order to be optimized in the areas with most useful input signal, and as a compensation allowing for degradation in the areas with low probability of useful input signal. As optimal value with respect to distortion is CR=1 which results in linear amplification.

Statistical Signal Analysis

The most convenient tool for statistical analysis is a histogram representing a probability-density over a specific axis. In the case of dynamic range compression, the axis needs to be related to energy of the input signal, with a certain range on that axis divided into bin-intervals. Bin-intervals represent a resolution of the statistical analysis.

The notion of "useful input signal" suggests that even if the statistics is calculated over an axis of energy/level the value of density doesn't have to represent all occurrences of specific energy values in that area. The density can only relate to occurrences of signal with certain properties, and the occurrences of a signal without those properties would be ignored in a histogram. For example, only a speech-like signal can be chosen to influence the statistics while histogram would be immune to noise-like signal of same level.

In the following we will assume use of "importance-histogram" that represents probability density of occurrence of speech-like signal. To register an occurrence in importance-histogram, the signal has to satisfy two requirements: estimated energy has to have a certain value and voice activity detector has to signalize presence of speech. Alternative methods for indicating presence of voice signal such as in [Martin 2001] can be used. Implementation of voice activity detector is outside of scope of this invention.

Relations Between Gain, Output and CR

For better understanding it is helpful to note that the G(I) and O(I) curves are fully determined by each other. Compression ratio can also be represented as a function of I, however since CR is usually prescribed as a constant value over a certain dynamic range, CR(I) function will be a flat line with constant value CR(I)=CRpr (prescribed CR). Such CR(I) curve is in relation with a derivative of the O(I) and G(I) curves. CR(I) requires only a gain-offset or output-offset to uniquely determine G(I) or O(I) curve respectively.

Figure 4:
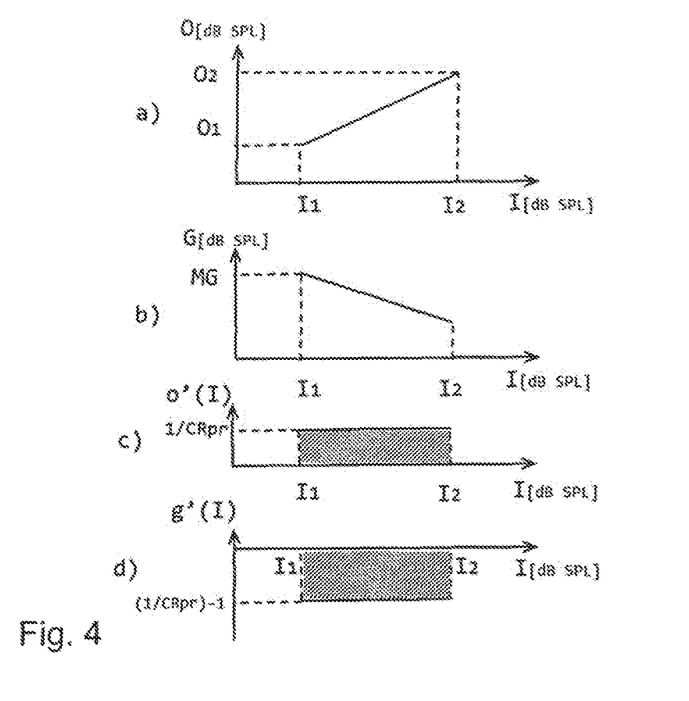

In the next explications, we will observe a finite portion of I-O curve shown in FIG. 4, determined with its final points. I1 at the low end of input dynamic range and I2 at the high end of input dynamic range. We assume that we have already calculated a histogram containing probability-density of "useful input signal" over this range.

$$CR(I) = CRpr = \Delta I/\Delta O = \frac{I2 - I1}{O(I2) - O(I1)} = \frac{I2 - I1}{I2 + G(I2) - I1 - G(I1)}$$

where CRpr is prescribed CR, $o'(I)=\Delta O/\Delta I=1/CRpr$ is prescribed derivative (slope) of O(I) curve, $g'(I)=\Delta G/\Delta I=(1/CRpr)-1$ is prescribed derivative (slope) of G(I) curve.

Note that in FIG. 4d the size of shaded area between line $$g'(I) = \left(\frac{1}{CR(I)}\right) - 1 = \left(\frac{1}{CRpr}\right) - 1$$

and the abscissa $$g'(I) = \left(\frac{1}{CR(I)}\right) - 1 = 0$$

represents amount of reduction of dynamic range ΔI—a displacement caused by dynamically changing of gain, an ability of dynamic compressor to reduce (compress) dynamic range.

To win even more insight from the graphical representation of CR(I) we can show that integrating functions g'(I) and o'(I) from $I_1$, under assumption of $G(I_1)=MG$, we can calculate G(I) and O(I) in arbitrary point as illustrated in FIG. 4:

$$O(I) = \int_{I1}^{I} \frac{1}{CR(I)} dI$$

$$G(I) = \int_{I1}^{I} \left(\frac{1}{CR(I)} - 1\right) dI$$

In further explication we will concentrate only on relation between G(I) and CR(I).

If $$g'(I) = \frac{1}{CR(I)} - 1$$

is not held constant but allowed to be an arbitrary non-uniform function, it would then suffice in order for points G(I1) and G(I2) to be connected (thus maintaining the full mapping of dynamic ranges), that the shaded surface in FIG. 4d remains constant.

With some limitations on CR (1.0<CR(I)<∞), this condition maintains the continuous function for complete mapping of input dynamic range to prescribed output dynamic range.

Interesting in this exposition is to hint to an analogy between dynamic compression and transformations in linear algebra. In linear algebra, for a given linear transformation there is a non-zero vector that will be immune to transformation—it will be transformed into itself. Such vector is called "eigenvector" of the transformation. Or vice-versa, for given vector, there is a linear transformation that will not affect the vector. In an analogous point of view, for given input-signal vector, there is a distribution of CR over the input range that represents optimal transformation in terms of distortion of the output signal. To find or approximate such optimal distribution of CR is the aim of the next steps.

Figure 5:
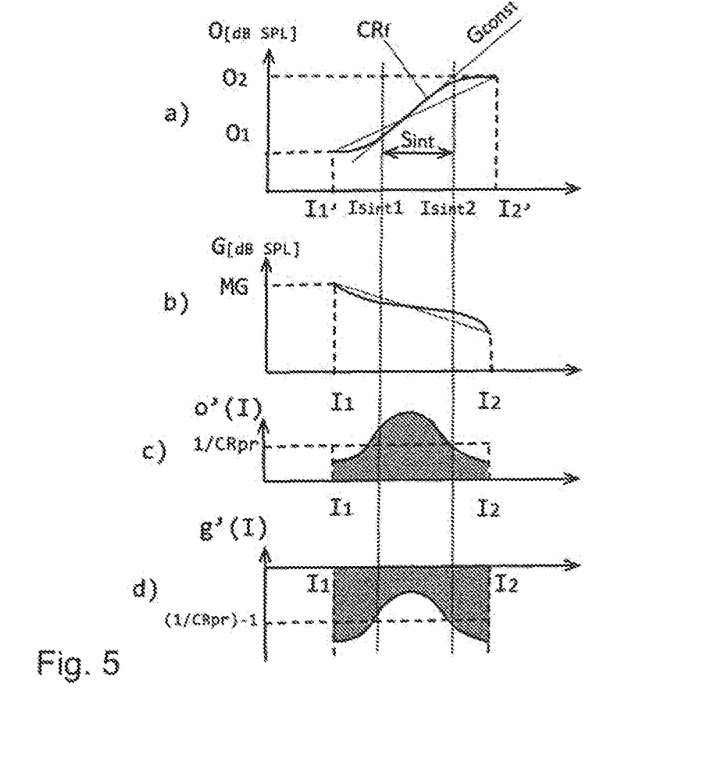

In the new method the compression ratio is continuous non-uniform function of I so that for each particular energy level of the input dynamic range there is a specific CR value—FIG. 5. Accordingly, the G(I) curve is not a straight line, but is always satisfy the relation between the derivative of G(I) curve and CR(I):

$$g'(I) = \frac{dG}{dI} = \frac{1}{CR(I)} - 1,$$

where g'(I) as the derivative of G(I) and represents specific gain displacement at certain I.

Determining the Optimal CR(I) and G(I) Curves

The new method assumes a given mapping condition completely specified by a single, constant value of prescribed Compression Ratio $CR_{pr}$ and the gain offset MG. The prescribed amount of compression has then to be distributed over the dynamic range of the input according to a current distribution-weighting function. The distribution-weighting function takes into account energy histogram or similar statistical description of the input signal. The method can compute any of CR(I), O(I) or G(I) curve in direct relation to distribution-weighting function.

The relation between importance-histogram and weighting function can follow different rationales. The most apparent rationale is to optimize signal distortion. In this case importance-histogram magnitude will represent the probability density of important signal (speech) and the weighting curve will be constructed in a way to increase linearity of the compressor—influence value of CR to tend towards 1.0- for those signals.

In the practical implementation of such system is more computationally-efficient to modify G(I) curve directly, and not by modifying CR(I) first. Gain values can then directly used to apply an appropriate amplification to the input signal.

The implementation in a signal processor is usually oriented toward methods of numerical analysis, instead of tools of symbolic function analysis (calculus). The calculation will therefore be performed in finite number of segments of input range.

As a starting point for the calculation of G(I) we use an importance-histogram H(i) over the specified input range—in this example a span between $I_1$=50 dBSPL and $I_2$=90 dBSPL. Importance-histogram can be computed on a grid of arbitrary resolution. In this case the uniform resolution of $\Delta i$=5 dB is used; which leads to number of histogram bin-intervals of hc=8. Importance-Histogram is established by counting the instances of useful speech signal in every of the 8 bin-intervals of input level.

Importance-histogram H(i) can be enhanced to achieve a specific bias. For example by applying square operator on importance-histogram values the contrast between peaks and valleys of H(i) can be emphasized.

If the dynamic range compression is performed in multiple frequency intervals, using multiple importance-histograms, then those histograms can be enhanced by taking into consideration the histograms in adjacent frequency intervals.

We intend to construct a weighting function that will reduce absolute value of gain displacement $$g'(I) = \frac{1}{CR(I)} - 1$$

in those bins where the importance-histogram shows high values. The importance-histogram H(i) can be in one example transformed into a distribution-weighting function as follows:

$$W(i) = \max_{k}\{H(k)\} - H(i);$$

then normalized, in order to satisfy the prescribed range-mapping as:

$$W_{norm}(i) = \frac{W(i)}{\sum_{k=1}^{hc} W(k)} \cdot hc.$$

Since the sum $$\sum_{i=1}^{hc} W_{norm}(i) = hc,$$

and since the importance-histogram has a constant bin-step $\Delta i = \Delta I/hc$ therefore $$\int_{\Delta I} W_{norm}(I)dI \triangleq \sum_{i=1}^{hc} W_{norm}(i) \cdot \Delta i = 1$$

This relation shows that $K_{norm}$ can be used to distribute compression ratio by non-uniformly distributing the prescribed gain-displacement $$\left(\frac{1}{CRpr} - 1\right)$$

over the input dynamic range as $$g'(i) = \left(\frac{1}{CR(i)} - 1\right) = \left(\frac{1}{CRpr} - 1\right) \cdot W_{norm}(i)$$

and maintain the overall mapping of dynamic range unchanged. Shaded Areas in FIG. 4d and FIG. 5d are of same surface.

From the reasons of efficient implementation we are interested in explicitly defining G(I) curve. Therefore we express gain for the end of each new segment as:

$$G(i) = G(i-1) + \left(\frac{1}{CRpr} - 1\right) \cdot W_{norm}(i), \text{ where } i = 1, \ldots hc;$$

and where additionally G(0)=MG is the gain specified by prescription for the very beginning of the input range.

Having calculated the new I-G curve with non-uniform distribution of CR, the actual Gain is determined according to short-time energy estimation.

This method can be generalized to application in plurality of frequency bands where the input signal is split into a number of sub-signals. The application of gain and energy estimation can be performed in time-domain or in the frequency-domain following signal analysis and prior to signal synthesis.

A new hearing device utilizing the method for non-uniform distribution of compression ratio over the dynamic range of Input Signals can perform the following tasks:
1. Fixed initial O(I) or G(I) curves are provided to describe mapping of input and output dynamic range. Those can be a result of audiological prescription of acoustical design of a particular use case. Those curves are stored in the memory of the hearing device.
2. The device also implements means for determining the energy of the input signal, finding an appropriate Gain from the G(I) curve and amplifying the input signal by applying the Gain as in known hearing devices.
3. In order to customize G(I) curve for use with an input signal with known statistical properties, the energy estimation of the input signal is statistically analyzed, in particular example by calculating histograms over determined time interval.
4. The histogram of input signal is used to determine optimal non-uniform distribution of CR(I) and to calculate customized G(I) curves according to such non-uniformly distributed CR.
5. Once the G(I) curves are updated, calculation and application of Gain is performed in a same manner as in known hearing devices Those tasks will be now presented in more detail.
1. During "fitting" process, based on audiometric assessment of hearing loss, a prescription is calculated and provided to the Dynamic Range Compressor in form of O(I) or G(I) curves. The initial curves consists of linear segments, whereas a single linear segment covers the most important levels of the audible signals. This segment is determined by low end of dynamic range, high end of dynamic range and corresponding gains. A constant CR is inherent to this description. Another way of describing G(I) curve is to express dependence of gain from input level through CR and offset gain MG. This data is stored in the memory of a device and is used in real time to calculate gain for the most current estimation of energy and level of the input signal. In case the prescription is not based on individual audiometric measurements and calculated using fitting rules such as NAL NL-2, the G(I) curve can be determined during acoustical design of the device. Device can have multiple G(I) curves that are stored as separate "settings" of the device, whereas the user or an automatic system can select which one to activate. For example the activation can be done using an on-device button, or using remote control device such as mobile device with a dedicated app.
2. Energy of the input signal is estimated using a known procedure from hearing instruments. Power of time-limited frame of the signal is computed by squaring and summing the magnitudes of the signal samples. In case of frequency domain processing, a frame of input signal is undergoing the frequency analysis such as FFT and the frequency-domain output (complex number called "bin" in case of FFT) of this operation is related to the energy at the particular spectral segment. In case of FFT processing following parameters represent a realistic case: acoustic signal, sampled with fs=16 kHz can be analyzed on overlapping segments each 4 ms long, and using an overlap step of 1 ms. This provides a new energy estimation every 1 ms. This procedures should be known to any person familiar with this applications and will therefore not be described in more detail here.

In order to avoid strong fluctuations in estimate of the immediate energy as described above, the estimate is smoothed in time using known attack-release filtering methods. Important parameters in the attack-release smoothing are the time constants: attack time and release time. According to wide-spread approach the choice for the time constants is made as: attack time 4 to 15 ms, release time 40 to 250 ms. The function of attack-release filters should be known to any person familiar with this applications and will therefore not be described in more detail here. The important characteristic of the method is that the time constants as selected above represent fast-acting energy estimation, or in other words a syllabic energy estimation.

In the following the terms "energy" and "power" will represent equivalent physical characteristic, however with energy having more time-immediate quality and power relating to more time-averaged characteristics. Since both energy and power concern signal of non-zero duration, the distinction is not clear-cut and the terms can be used as substitutes for each other.

Calculation of gain is performed by finding a working point on the G(I) curve for current power estimation. The gain is applied either by multiplying time-domain samples with the Gain, or multiplying the appropriate frequency channel in case of frequency domain processing as in FIG. 6.

3. Now follow the steps that differ from the prior-art methods known from the conventional dynamic range compressors.

First step is the collection of statistic properties of the input signal. The statistic properties can be represented through different tools such as peak count, minimum statistics, or histogram according to immediate energies or power estimation. In following description we will concern a importance-histogram using immediate energies of the signal.

Immediate energies calculated every 1 ms are transformed into log domain so that they correspond to SPL levels of the acoustical signals or to the certain range of the dynamic range of the device (this is more general, since we are not always in knowledge of SPL correspondence).

The histogram is calculated for a certain portion of the dynamic range and is immunized against the energy values that fall outside of given range. In our implementation we target the input dynamic range from 50 dBSPL to 90 dBSPL.

The histogram over this range has a resolution of 5 dB resulting in Nc=8 separated cells. A higher resolution could also be applied, as well as non-uniform resolution with cells having different widths. Corresponding energy thresholds are computed and form a look-up table for assigning every immediate energy to a density cell of the histogram. In fixed-point digital implementations of this method, mapping of the energy values to a histogram can efficiently be performed by observing a limited number of MSB (most significant bits) of the energy value: those bits can denote the index of the histogram cell.

To establish statistically valid histogram energy values are assigned to the histogram cells over time of 500 ms. During this time a different number of energy instances $N_{obs}$ can be collected, with overshoots and undershoots outside of the range being ignored. In order for histogram to be statistically confident, only those histograms will be taken into consideration where at least 50% of maximal number of possible values are collected. The histograms not satisfying the confidence condition are assumed flat—all cells having same density. After every 500 ms, the histogram is processed and reset by deleting all density valued for the cells—before collection is resumed.

In order to avoid excessive fluctuations of gain that might result from large differences between consecutive histograms, histograms are smoothed in time using iir low-pass filtering with forgetting coefficient of α=0.5:

$$Hsmooth(n)=\alpha \cdot Hsmooth(n-1)+(1-\alpha) \cdot H(n),$$

where n denotes a time instant.

Figure 7:
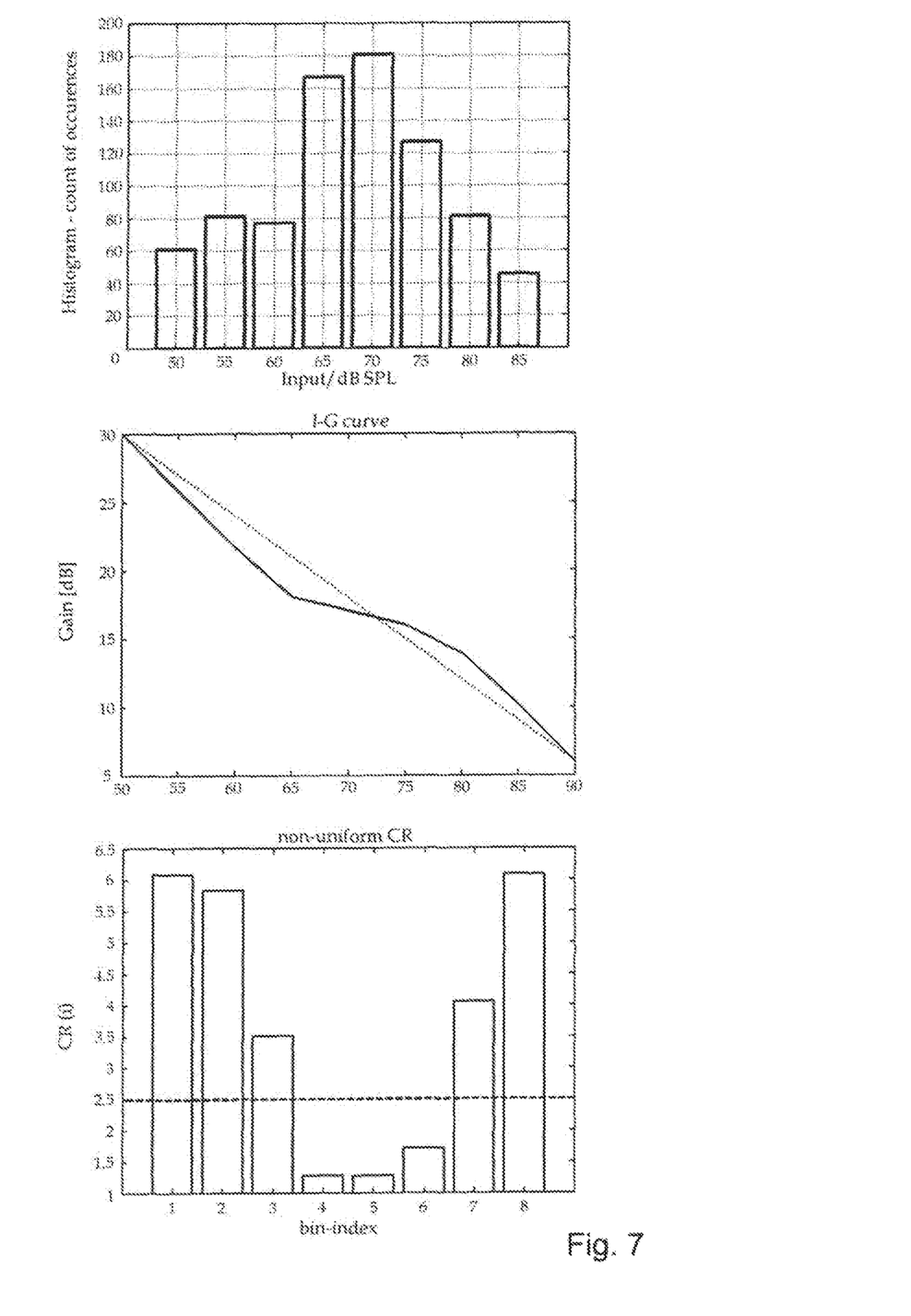

Result is a smoothed histogram $H_{smooth}(n)$ representing most recent statistical characteristic of input signal. Top diagram in FIG. 7 shows a typical smoothed histogram for speech input of medium loudness.

4. In this step, the statistical properties of input signal (as in $H_{smooth}(n)$) are used to determine the current distribution of CR across the dynamic range. The rationale is to move CR values closer to 1 in the higher valued histogram cells, in effect to make amplification maximally linear where the probability of important signal is highest.

In order to satisfy the prescribed CR over the full dynamic range the distribution-weighting curve is calculated as:

$$W(i) = \max_k \{H(k)\} - H(i);$$

and then normalized as:

$$W_{norm}(i) = \frac{W(i)}{\sum_{k=1}^{hc} W(k)} \cdot hc.$$

The gains at the upper boundary of each interval is $$G(i) = G(i-1) + \left(\frac{1}{CRpr} - 1\right) \cdot W_{norm}(i), \text{ where } i = 1, \ldots hc;$$

and where additionally G(0)=MG is the gain specified by prescription for the very beginning of the input range.

FIG. 7 shows an example non-uniformly distributed CR(i) in the bottom diagram and a corresponding G(I) in middle diagram. Dashed lines represent the initial values for uniform CR(i)=CRpr and corresponding initial G(I) curve.

5. At this moment we have at disposal specific CR and Gain offsets for every of the input energy intervals. For efficient computational implementation I-G a table of derivatives (slopes) g'(i) and MG(i)—gains at the beginning of each segment—is stored in the memory of the device. Calculation of a current working point on I-G curve consists of finding the appropriate cell and then calculating working gain depending of position of working point in the cell. Once the cell "i" is found, the position of the current working point within the cell determines the gain:

$$G(I)=MG(i)+g'(i)\cdot(I-I_{cell}(i)); \text{ and } I_{cell}(i)/\geq I > I_{cell}(i+1)$$

where $I_{cell}(i)$ determines the level at the lower boundary of the cell i.

In fixed-point digital implementations of this method, searching of appropriate cell for the current energy value (power estimation) can efficiently be performed by assigning a limited number of MSB (most significant bits) of the energy value (power estimation) to a index of segment. If those MSB determine a segment singularly, the remaining bits represents position of the input energy/power within the segment.

Having determined current Gain value, the amplification on the current frames of input signal is performed by multiplication of signal samples or bins with an appropriate factor.

Of course, the invention is not limited to the examples given in this specification. In particular the invention is not delimited to the precise values used in the exemplary calculations and equations, which merely show one embodiment of the invention that can be carried out by a person skilled in the art. In view of the disclosure of this application, a person skilled in the art is able to adjust the exemplary embodiments accordingly, in particular to set or modify the calculations and parameters described above. Accordingly, the characteristics described for a variants or embodiments may also be present in other variants or forms of use and can be combined with each other.

REFERENCES

[Plomp 1988] Plomp R. The negative effect of amplitude compression in multichannel hearing aids in the light of the modulation transfer function. J Acoust Soc Am. 1988; 83:2322-2327.

B. J. C. Moore, Cochlear hearing loss, Second edition, John Wiley & Sons, 2008

Thomas F. Quatiery, Discrete-time Speech Signal Processing, Prentice Hall 2002

[Moore 2016] Moore BC, Sęk A. Preferred Compression Speed for Speech and Music and Its Relationship to Sensitivity to Temporal Fine Structure. Trends in Hearing. 2016 Sep. 7.

[NAL 2011] G. Keidser, H. Dillon, M. Flax, T. Ching, and S. Brewer, The NAL-NL2 Prescription Procedure, Audiological Research 2011

[Martin 2001] Noise power spectral density estimation based on optimal smoothing and minimum statistics, IEEE Transactions on Speech and Audio Processing (Volume: 9, Issue: 5, July 2001)

The invention claimed is:

1. A method for processing an acoustic input signal, the method comprising:
   a) receiving a digital representation of an acoustic input signal,
   b) calculating at least one statistical parameter of the digital representation of the acoustic input signal,
   c) calculating a compression ratio function based on a prescribed constant compression ratio that includes information with regard to a prescribed minimum magnitude of the input signal and a prescribed minimum magnitude of a corresponding output signal and a prescribed maximum magnitude of the input signal and a prescribed maximum magnitude of the corresponding output signal, where:

the prescribed constant compression ratio uniformly maps acoustic input signals of a selected magnitude to acoustic output signals of a selected magnitude;

a minimum magnitude of the input signal and a minimum magnitude of the output signal of a non-uniform compression ratio function equals the prescribed minimum magnitude of the input signal and the prescribed minimum magnitude of the corresponding output signal of the prescribed constant compression ratio;

a maximum magnitude of the input signal and a maximum magnitude of the output signal of the non-uniform compression ratio function equals the prescribed maximum magnitude of the input signal and the prescribed maximum magnitude of the output signal of the prescribed constant compression ratio; and the non-uniform compression ratio function matches a non-uniform continuous curve stretching from a first point given by the minimum magnitude of the input signal and the minimum magnitude of the output signal to a second point given by the maximum magnitude of the input signal and a maximum magnitude of the output signal, and on at least one statistical parameter calculated in step b), wherein the compression ratio function deviates from the prescribed constant compression ratio by including a non-uniform mapping of acoustic input signals of a selected magnitude to acoustic output signals of a selected magnitude, wherein the non-uniformity of the mapping procedure is determined based on at least one statistical parameter calculated according to step b), and d) applying the non-uniform compression ratio function according to step c) on the digital representation of the acoustic input signal to deliver a digital representation of an enhanced acoustic output signal.

2. The method according to claim 1, wherein the non-uniform compression ratio function is only applied to the input signal within a range between the minimum prescribed input signal and the maximum prescribed input signal.

3. The method according to claim 2, wherein the at least one statistical parameter calculated in step b) comprises information with regard to the magnitudes of the input signal at given sample rates.

4. The method according to claim 3, wherein the at least one statistical parameter calculated in step b) comprises a histogram of magnitudes of the input signal representing samples having a magnitude between 40 and 90 dB SPL and wherein the gradient of the non-uniform compression ratio function essentially matches the envelope of the histogram.

5. The method according to claim 4, wherein the digital representation of the input signal is split into a number of frequency channels, where the frequency channels split an initial range of at least 250 Hz to 4 kHz into frequency intervals, the frequency intervals having a reduced frequency range in comparison with the initial range.

6. The method according to claim 5, wherein the compression ratio function for each frequency interval is calculated based on statistical parameters derived not only from the present frequency interval, but also from at least one of any other frequency intervals.

7. The method according to claim 6, wherein the calculation is based on a neighbouring frequency interval.

8. An audio processing device, comprising:

a processor; and a storage medium containing a program-logic application, where the program-logic application directs the processor to:

a) receive a digital representation of an acoustic input signal;

b) calculate at least one statistical parameter of the digital representation of the acoustic input signal;

c) calculate a compression ratio function based on a prescribed constant compression ratio that includes information with regard to a prescribed minimum magnitude of the input signal and a prescribed minimum magnitude of a corresponding output signal and a prescribed maximum magnitude of the input signal and a prescribed maximum magnitude of the corresponding output signal, where:

the prescribed constant compression ratio uniformly maps acoustic input signals of a selected magnitude to acoustic output signals of a selected magnitude;

a minimum magnitude of the input signal and a minimum magnitude of the output signal of a non-uniform compression ratio function equals the prescribed minimum magnitude of the input signal and the prescribed minimum magnitude of the corresponding output signal of the prescribed constant compression ratio;

a maximum magnitude of the input signal and a maximum magnitude of the output signal of the non-uniform compression ratio function equals the prescribed maximum magnitude of the input signal and the prescribed maximum magnitude of the output signal of the prescribed constant compression ratio; and the non-uniform compression ratio function matches a non-uniform continuous curve stretching from a first point given by the minimum magnitude of the input signal and the minimum magnitude of the output signal to a second point given by the maximum magnitude of the input signal and a maximum magnitude of the output signal, and on at least one statistical parameter calculated in step b), wherein the compression ratio function deviates from the prescribed constant compression ratio by including a non-uniform mapping of acoustic input signals of a selected magnitude to acoustic output signals of a selected magnitude, wherein the non-uniformity of the mapping procedure is determined based on at least one statistical parameter calculated according to step b); and d) apply the non-uniform compression ratio function according to step c) on the digital representation of the acoustic input signal to deliver a digital representation of an enhanced acoustic output signal.

9. The audio processing device according to claim 8, wherein the audio processing device is realized as one of the following devices: mobile phone, headphone, hands free speakerphone, audio speaker, hearing aid, device for hearing protection, device for reproduction of audio-visual media.

10. A hearing aid, comprising:
an audio processing device, comprising:
  a processor; and
  a storage medium containing a program-logic application, where the program-logic application directs the processor to:
    a) receive a digital representation of an acoustic input signal;
    b) calculate at least one statistical parameter of the digital representation of the acoustic input signal;
    c) calculate a compression ratio function based on a prescribed constant compression ratio that includes information with regard to a prescribed minimum magnitude of the input signal and a prescribed minimum magnitude of a corresponding output signal and a prescribed maximum magnitude of the input signal and a prescribed maximum magnitude of the corresponding output signal, where:
      the prescribed constant compression ratio uniformly maps acoustic input signals of a selected magnitude to acoustic output signals of a selected magnitude;
      a minimum magnitude of the input signal and a minimum magnitude of the output signal of a non-uniform compression ratio function equals the prescribed minimum magnitude of the input signal and the prescribed minimum magnitude of the corresponding output signal of the prescribed constant compression ratio;
      a maximum magnitude of the input signal and a maximum magnitude of the output signal of the non-uniform compression ratio function equals the prescribed maximum magnitude of the input signal and the prescribed maximum magnitude of the output signal of the prescribed constant compression ratio; and
      the non-uniform compression ratio function matches a non-uniform continuous curve stretching from a first point given by the minimum magnitude of the input signal and the minimum magnitude of the output signal to a second point given by the maximum magnitude of the input signal and a maximum magnitude of the output signal, and
    on at least one statistical parameter calculated in step b),
    wherein the compression ratio function deviates from the prescribed constant compression ratio by including a non-uniform mapping of acoustic input signals of a selected magnitude to acoustic output signals of a selected magnitude, wherein the non-uniformity of the mapping procedure is determined based on at least one statistical parameter calculated according to step b); and
    d) apply the non-uniform compression ratio function according to step c) on the digital representation of the acoustic input signal to deliver a digital representation of an enhanced acoustic output signal;
  means for receiving an acoustic input signal and for transforming the acoustic input signal into a digital representation of the acoustic input signal and delivering the digital representation to the audio processing device; and
  means for transforming the digital output signal of the audio processing device into an enhanced acoustic signal.

* * * * *